(12) United States Patent
Mao et al.

(10) Patent No.: US 10,568,234 B1
(45) Date of Patent: Feb. 18, 2020

(54) LIQUID-IMMERSION COOLING DEVICE

(71) Applicant: HONGFUJIN PRECISION ELECTRONICS (TIANJIN) CO., LTD., Tianjin (CN)

(72) Inventors: Tze-Chern Mao, New Taipei (TW); Chih-Hung Chang, New Taipei (TW); Yen-Chun Fu, New Taipei (TW); Yao-Ting Chang, New Taipei (TW); Li-Wen Chang, New Taipei (TW); Chao-Ke Wei, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 16/379,301

(22) Filed: Apr. 9, 2019

(30) Foreign Application Priority Data

Feb. 25, 2019 (CN) .......................... 2019 1 0137820

(51) Int. Cl.
*H05K 7/20* (2006.01)

(52) U.S. Cl.
CPC ..... *H05K 7/20236* (2013.01); *H05K 7/20272* (2013.01); *H05K 7/20772* (2013.01)

(58) Field of Classification Search
CPC ........... H01L 2924/0002; H01L 23/473; H01L 23/44; H05K 7/203; H05K 7/20236; H05K 7/20781; H05K 7/20272; H05K 7/20218; H05K 7/2029; H05K 7/20818; H05K 7/20763; H05K 7/20836; H05K 7/20327; H05K 7/20281; H05K 5/067; H05K 7/20627; H05K 7/208; H05K 7/20927; H05K 7/20936; G06F 1/20; G06F 2200/201; F28D 2021/0028; F28F 2250/08

USPC ....................... 361/699, 700, 679.46, 679.53
See application file for complete search history.

(56) References Cited

U.S. PATENT DOCUMENTS 9,781,862 B2 * 10/2017 Kolstad ............... E21B 41/0007

\* cited by examiner

*Primary Examiner* — Mandeep S Buttar
(74) *Attorney, Agent, or Firm* — ScienBiziP, P.C.

(57) ABSTRACT

A liquid-immersion cooling device includes a reservoir, a partition board, and a heat exchanger. The reservoir contains coolant to immerse the electronic device. The partition board and the heat exchanger are mounted within the reservoir. The partition board is arranged parallel to the electronic device. The heat exchanger and the electronic device are respectively arranged on opposite sides of the partition board within the reservoir. The partition board is configured to guide a flow of the coolant within the reservoir. When the coolant flows through the electronic device and carries away heat generated by the electronic device, the coolant carrying the heat is guided by the partition board to flow through the heat exchanger. After exchanging heat with the heat exchanger, the coolant is guided by the partition board to flow through the electronic device.

10 Claims, 5 Drawing Sheets

LIQUID-IMMERSION COOLING DEVICE

FIELD

The subject matter herein generally relates to cooling devices, and more particularly to a liquid-immersion cooling device for cooling an electronic device.

BACKGROUND

Generally, liquid-immersion cooling devices for cooling servers involve immersing the servers in a device containing a non-conductive liquid. At the same time, an additional cooling device is required to provide coolant to the device in which the servers are placed while the server are immersed in the coolant. Delivery of the coolant requires pumping, which requires extra power. Furthermore, the distance between the cooling device and the device in which the servers are placed increases the amount of the insulating coolant required, which increases a cost of cooling the servers.

BRIEF DESCRIPTION OF THE DRAWINGS

Implementations of the present disclosure will now be described, by way of embodiments, with reference to the attached figures.

DETAILED DESCRIPTION

Figure 1:
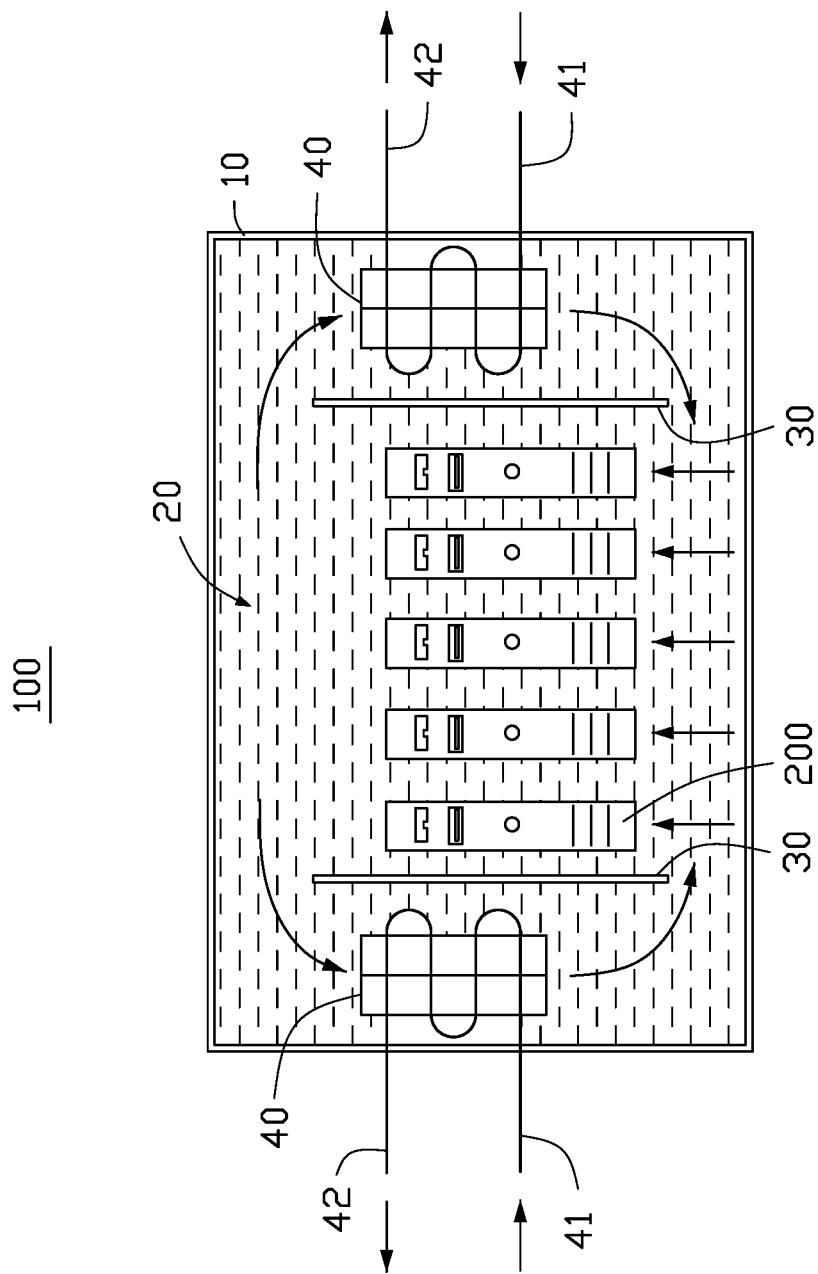
FIG. 1 is a cross-sectional view of a first embodiment of a liquid-immersion cooling device.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 shows a first embodiment of a liquid-immersion cooling device 100 for cooling a plurality of electronic devices 200. Each of the plurality of electronic devices 200 may be a server. It can be understood that in other embodiments, the electronic device 200 can be other devices that need to be cooled.

The liquid-immersion cooling device 100 includes a reservoir 10 for containing coolant 20 to immerse the electronic devices 200. The liquid-immersion cooling device 100 further includes two partition boards 30 and two heat exchangers 40. The partition boards 30 are arranged parallel to the electronic devices 200. The partition boards 30 and the heat exchangers 40 are received within the reservoir 10. The electronic devices 200 are arranged between the two partition boards 30. Each of the two heat exchangers 40 is arranged on a side of a respective partition board 30 facing away from the electronic devices 200. The partition boards 30 guide a flow of the coolant 20 within the reservoir 10.

The coolant 20 flows in different directions according to a difference in temperature. When the coolant 20 flows through the electronic devices 200 and carries away heat generated by the electronic devices 200, the coolant 20 carrying the heat is guided by the partition boards 30 to flow through the heat exchangers 40. After the coolant 20 exchanges heat with the heat exchangers 40, the coolant 20 is guided by the partition boards 30 to flow through the electronic devices 200. As shown in FIG. 1, the coolant flows through the electronic devices 200 to a top of the reservoir 10 along a vertical direction, and then flows through the heat exchangers 40 to a bottom of the reservoir 10 along the vertical direction.

The reservoir 10 has a substantially rectangular cross-sectional shape. It can be understood that the shape of the reservoir 10 is not limited thereto, and may be replaced with other shapes. Furthermore, a size of the reservoir 10 can also be adjusted according to actual needs. The electronic devices 200 are arranged parallel to each other within the reservoir 10, and a number of the electronic devices 200 can be set according to specific requirements.

The coolant 20 is directly contained within the reservoir 10 to immerse the electronic device 200.

As shown in FIG. 1, a gap is defined between each two adjacent electronic devices 200, and a gap is defined between each partition board 30 and the adjacent electronic device 200. The coolant 20 can flow through the gaps to carry away heat generated by the electronic devices 200. In another embodiment, there are no gaps defined between each two adjacent electronic devices 200, such that the coolant 20 directly flows through the electronic devices 200 to carry away heat generated by components within the electronic devices 200. The plurality of electronic devices 200 and the two partition boards 30 are arranged parallel to each other. A size of the partition boards 30 is larger than a size of the electronic devices 200. Furthermore, a height of the partition boards 30 is greater than a height of the electronic devices 200 to guide the flow of the coolant 20. It can be understood that in other embodiments, the liquid-immersion cooling device 100 can include only one partition 30, and a size of the partition 30 can be set according to a size of the reservoir 10.

The two heat exchangers 40 are respectively arranged on opposite sides of the partition boards 30 facing away from the electronic devices 200. It can be understood that when the liquid-immersion cooling device 100 only includes one of the partition boards 30, the heat exchangers 40 are arranged according to requirements.

Each heat exchanger 40 includes a inflow port 41 and a outflow port 42. In one embodiment, each heat exchanger 40 is coupled to an external supply device by the inflow port 41 and the outflow port 42. The outflow port 42 is arranged at an upper portion of the reservoir 10, and the inflow port 41 is arranged at a lower portion of the reservoir 10. The heat exchanger 40 supplies cooling water from the external supply device, and the cooling water enters the heat exchanger 40 from the inflow port 41. After the heat exchanger 40 and the coolant 20 in the reservoir 10 exchange heat, the water in the heat exchanger 40 flows out of the heat exchanger 40 from the outflow port 42.

The coolant 20 flows through the reservoir 10 to carry away heat generated by the electronic devices 200, and then flows through the heat exchangers 40. Due to natural convection, the coolant 20 carrying heat flows above the coolant 20 without heat. The external supply device supplies cooling water to the heat exchanger 40 through the inflow port 41. After the cooling water enters the heat exchanger 40, the heat exchanger 40 exchanges heat with the coolant 20. After the coolant 20 exchanges heat with the heat exchangers 40, the coolant is guided by the partition boards 30 to flow through the electronic devices 200 from a bottom end of the electronic devices 200. The heated water in the heat exchanger 40 flows out of the reservoir through the outflow port 42.

Through the above-described embodiment, the external supply device continuously supplies cooling water to the heat exchangers 40, the heat exchangers 40 continuously exchange heat with the coolant, and the coolant continuously carries away heat generated by the electronic devices 200.

Figure 2:
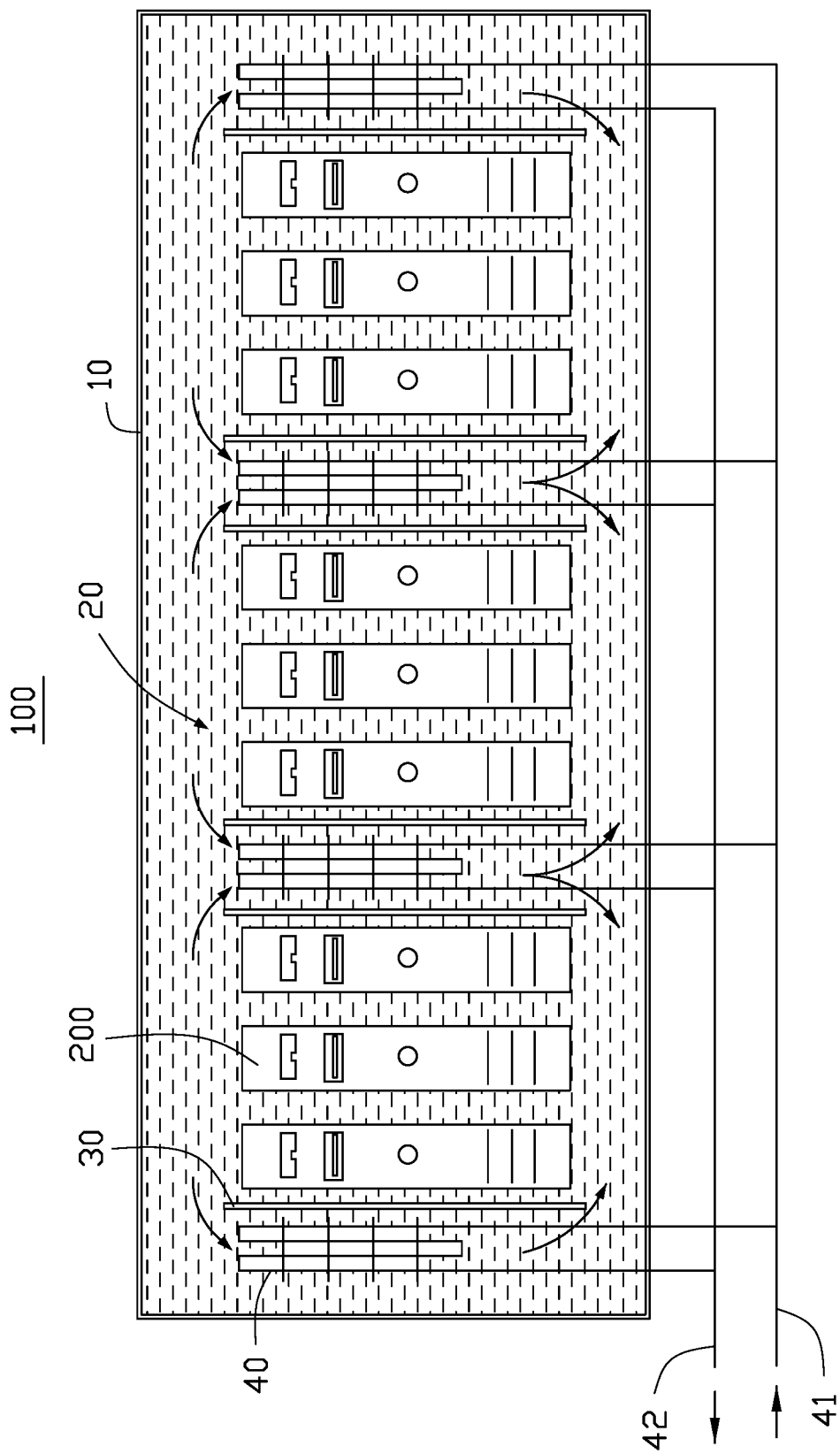
FIG. 2 is a cross-sectional view of a second embodiment of a liquid-immersion cooling device.

FIG. 2 shows a second embodiment of a liquid-immersion cooling device 100 for cooling a plurality of sets of electronic devices 200. The second embodiment differs from the first embodiment in that the liquid-immersion cooling device 100 includes a plurality of sets of partition boards 30 and a plurality of sets of heat exchangers 40. Each set of partition boards 30 includes two partition boards 30. Each set of electronic devices 200 is arranged between a respective set of partition boards 30. Each heat exchanger 40 is arranged between two partition boards 30 of adjacent sets of partition boards 30 or arranged between a sidewall of the reservoir 10 and the partition board 30 of the adjacent set of partition boards 30. The second embodiment further differs from the first embodiment in that the external supply device is coupled to the plurality of sets of partition boards 30 by one inflow port 41 and one outflow port 42. The inflow port 41 is coupled to the plurality of heat exchangers 40 in parallel. In other words, the inflow port 41 supplies cooling water to each of the plurality of heat exchangers 40 in parallel, and each of the plurality of heat exchangers 40 supplies heated water to the heating pipe in parallel. Thus, each heat exchanger 40 receives cooling water of the same temperature to sufficiently carry away heat generated by the plurality of electronic devices 200.

Through the above-described embodiment, the external supply device is coupled to the plurality of heat exchangers 40 by only one inflow port 41 and one outflow port 42, which simplifies a connection between the liquid-immersion cooling device 100 and the external supply device.

Figure 3:
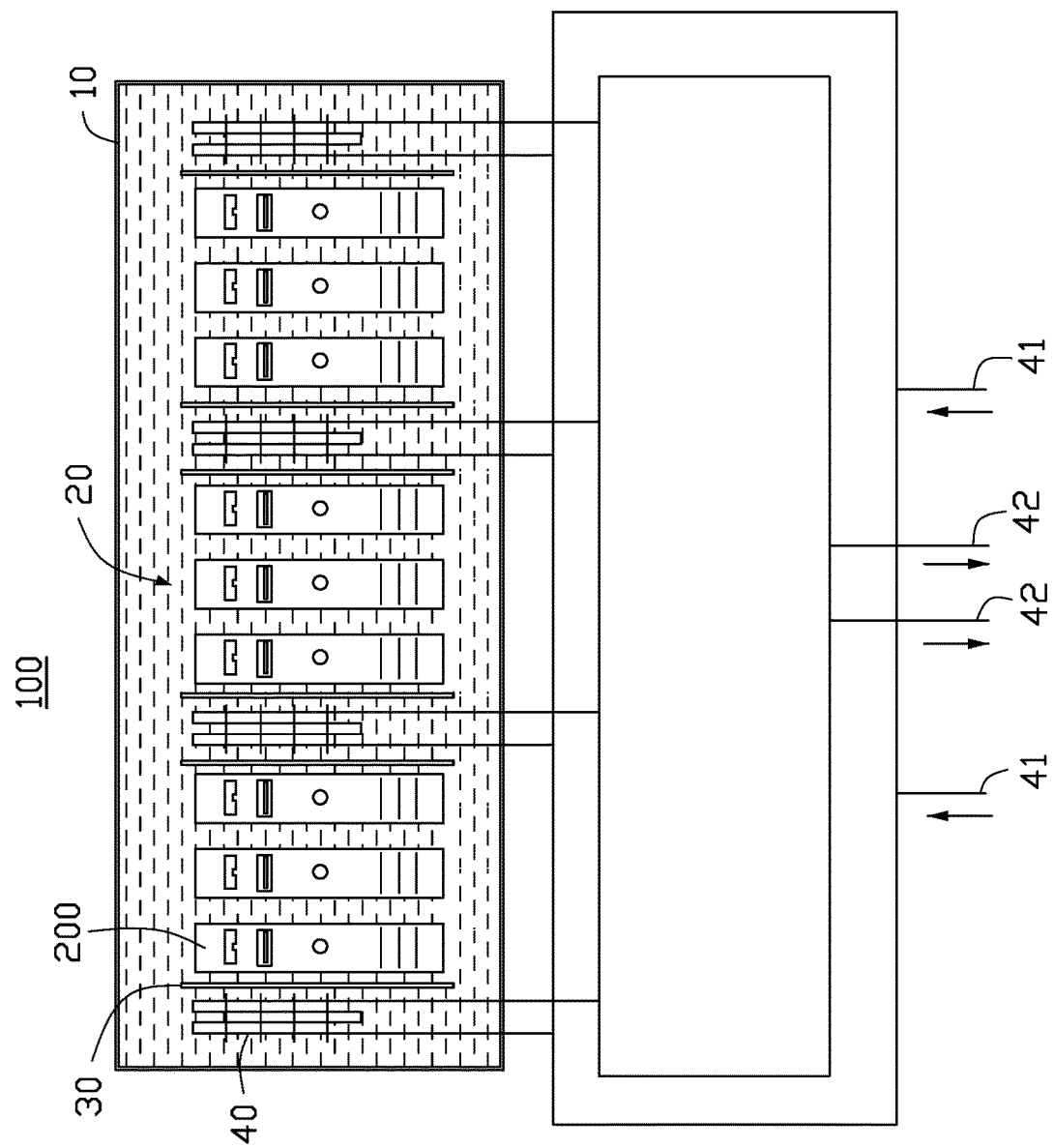
FIG. 3 is a cross-sectional view of a third embodiment of a liquid-immersion cooling device.

FIG. 3 shows a third embodiment of a liquid-immersion cooling device 100. Similar to the second embodiment, the external supply device is coupled to the plurality of heat exchangers 40 in parallel. The third embodiment differs from the second embodiment in that the external supply device of the third embodiment is coupled to the plurality of heat exchangers 40 by two inflow ports 41 and two outflow ports 42.

In the third embodiment, the two inflow ports 41 form an annular loop structure, and the two outflow ports 42 form an annular loop structure. The two inflow ports 41 and the two outflow ports 42 are arranged on one side of the reservoir 10.

The cooling water from the external supply device flows to the heat exchangers 40 in parallel through the annular loop structure of the two inflow ports 41. After the cooling water exchanges heat with the coolant 20 in the heat exchangers 40, the heated cooling water flows out of the heat exchangers 40 through the annular loop structure of the two outflow ports 42.

Figure 4:
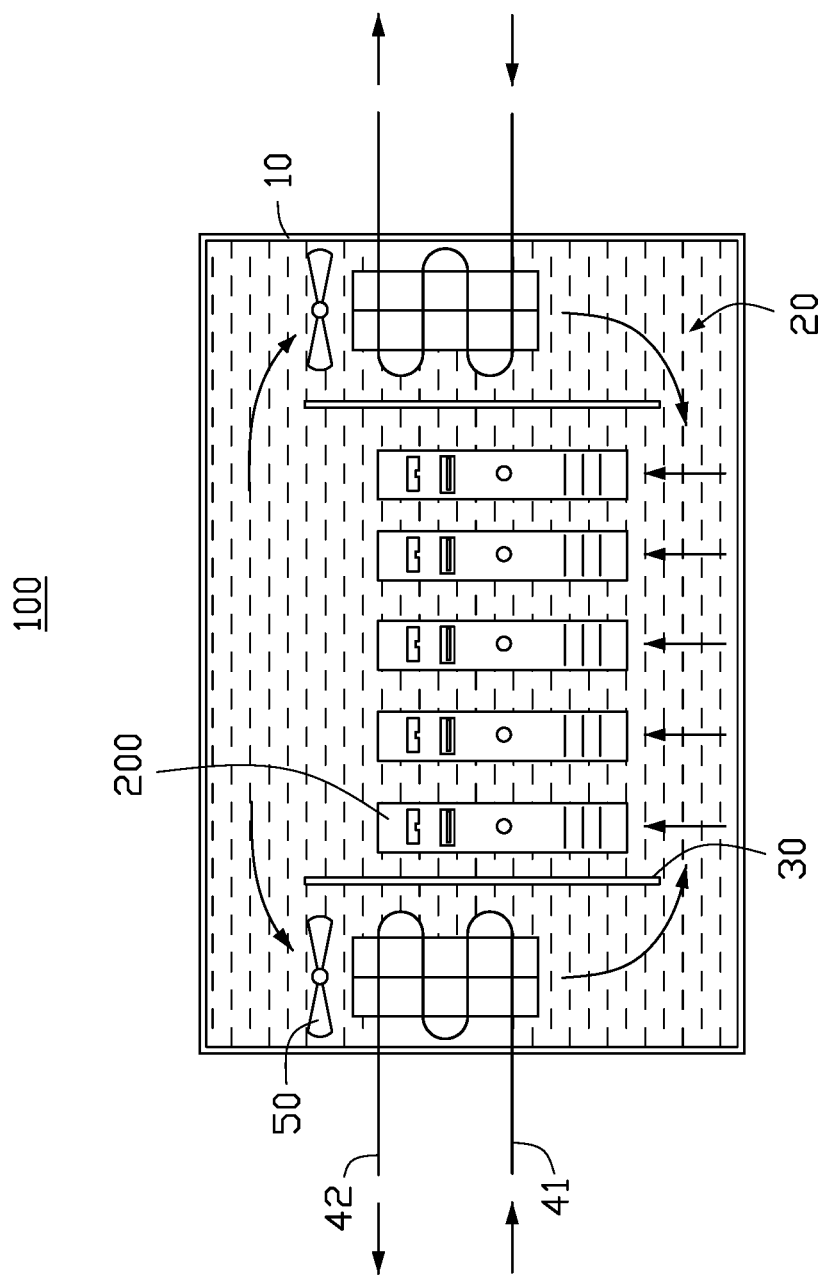
FIG. 4 is a cross-sectional view of a fourth embodiment of a liquid-immersion cooling device.

FIG. 4 shows a fourth embodiment of a liquid-immersion cooling device 100 similar to the first embodiment. The fourth embodiment differs from the first embodiment in that the liquid-immersion cooling device 100 further includes a driving member 50 for driving the flow of the coolant 20. The driving member 50 includes a blade. The driving member 50 is arranged at one end of the heat exchanger 40 at an upper portion of the reservoir 10. The driving member 50 and the heat exchanger 40 are located on a same side of the partition board 30. The driving member 50 is arranged above the heat exchanger 40 to accelerate the flow of coolant 20 to the heat exchanger 40.

The addition of the driving member 50 improves efficiency of heat exchange between the coolant 20 and the heat exchanger 40.

Figure 5:
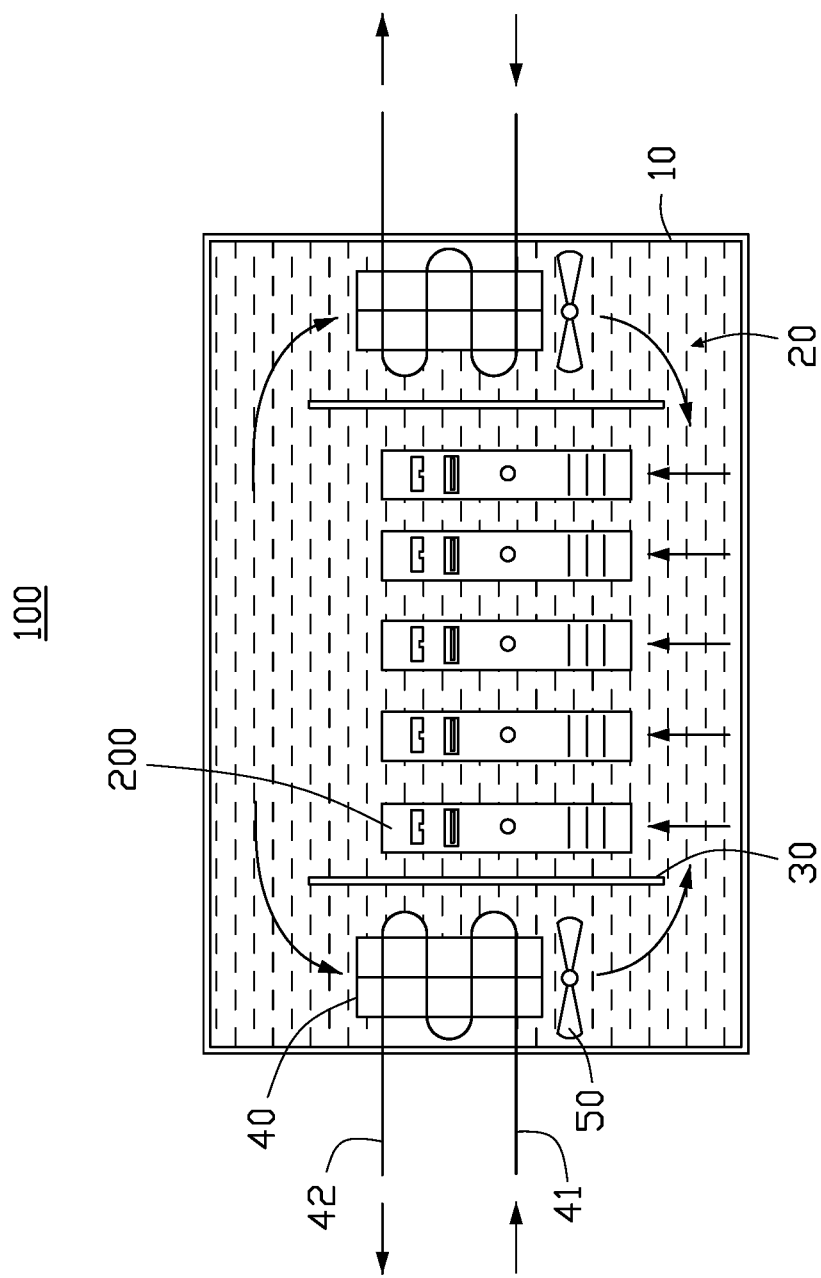
FIG. 5 is a cross-sectional view of a fifth embodiment of a liquid-immersion cooling device.

FIG. 5 shows a fifth embodiment of a liquid-immersion cooling device 100 similar to that of the fourth embodiment. The fifth embodiment differs from the fourth embodiment in that the driving member 50 is arranged at an end of the heat exchanger 40 at a lower portion of the reservoir 10 to accelerate the flow of the coolant 20 that has finished exchanging heat with the heat exchanger 40.

In summary, the liquid-immersion cooling device 100 in the above-described embodiments directly mount the heat exchanger 40 within the reservoir 10, such that the heat exchanger 40 contacts the coolant 20 to exchange heat with the coolant 20. Thus, an external cooling device is not required to be mounted inside the reservoir 10 to supply the coolant 20, which simplifies the structure and saves on a cost of cooling the electronic device 200.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A liquid-immersion cooling device comprising: a reservoir configured to contain coolant to immerse a plurality of electronic devices; at least one partition board; and at least one heat exchanger; wherein: the at least one partition board and the at least one heat exchanger are mounted within the reservoir; the at least one partition board is arranged parallel to the plurality of electronic devices; the at least one heat exchanger and the plurality of electronic devices are respectively arranged on opposite sides of the at least one partition board within the reservoir; the at least one partition board is configured to guide a flow of the coolant within the reservoir; when the coolant flows through the plurality of electronic devices and carries away heat generated by the plurality of electronic devices, the coolant is guided by the at least one partition board to flow through the at least one heat exchanger; after exchanging heat with the at least one heat exchanger, the coolant is guided by the at least one partition board to flow through the plurality of electronic devices; wherein: the at least one heat exchanger comprises a inflow port and an outflow port; the inflow port and the outflow port couple the at least one heat exchanger to an external supply device located outside of the reservoir; and further comprising at least two partition boards and at least two heat exchangers, wherein: the at least two partition boards are arranged parallel to each other; the plurality of electronic devices are arranged between the at least two partition boards; the at least two heat exchangers are respectively arranged on a side of the at least two partition boards facing away from the plurality of electronic devices.

2. The liquid-immersion cooling device of claim 1, wherein: each of the at least two heat exchangers comprises a inflow port and a outflow port; the inflow port receives cooling water from the external supply device, and the cooling water flows through the outflow port to the external supply device; the inflow port and the outflow port of each heat exchanger are coupled to the external supply device in series.

3. The liquid-immersion cooling device of claim 2, wherein:
the at least two heat exchangers are arranged on two respective sides of the reservoir within the reservoir.

4. The liquid-immersion cooling device of claim 3 further comprising a driving member arranged at one end of the heat exchanger, wherein the driving member is configured to accelerate a flow of the coolant through the driving member.

5. The liquid-immersion cooling device of claim 1, wherein:
the at least one heat exchanger is arranged higher than the plurality of electronic devices along a vertical direction of the reservoir.

6. A liquid-immersion cooling device comprising:
a reservoir configured to contain coolant to immerse a plurality of sets of electronic devices;
a plurality of sets of partition boards; and
a plurality of heat exchangers; wherein:
the plurality of sets of partition boards and the plurality of heat exchangers are mounted within the reservoir;
the plurality of sets of partition boards are arranged parallel to the plurality of electronic devices;
each set of partition boards comprises two partition boards;
each set of electronic devices is arranged between a respective set of partition boards;
each heat exchanger is arranged between two partition boards of adjacent sets of partition boards or arranged between a sidewall of the reservoir and the partition board of the adjacent set of partition boards;
the plurality of sets of partition boards is configured to guide a flow of the coolant within the reservoir;
when the coolant flows through the plurality of electronic devices and carries away heat generated by the plurality of electronic devices, the coolant carrying the heat is guided by the plurality of sets of partition boards to flow through the plurality of heat exchangers;
after exchanging heat with the plurality of heat exchangers, the coolant is guided by the plurality of partition boards to flow through the plurality of electronic devices.

7. The liquid-immersion cooling device of claim 6, wherein:
the plurality of heat exchangers comprises a inflow port and a outflow port;
the inflow port and the outflow port couple the plurality of heat exchangers to an external supply device located outside of the reservoir.

8. The liquid-immersion cooling device of claim 7, wherein:
the inflow port receives cooling water from the external supply device, and the cooling water flows through the outflow port to the external supply device;
the inflow port and the outflow port are coupled to each of the plurality of heat exchangers in parallel.

9. The liquid-immersion cooling device of claim 8, wherein:
the inflow port and the outflow port are arranged on a same side of the reservoir;
the inflow port forms an annular loop structure; and
the outflow port forms an annular loop structure.

10. The liquid-immersion cooling device of claim 9, wherein:
the plurality of heat exchangers comprises two inflow ports and two outflow ports.

* * * * *